US007375400B2

(12) United States Patent
Itoh et al.

(10) Patent No.: US 7,375,400 B2
(45) Date of Patent: May 20, 2008

(54) FIELD EMISSION DISPLAY DEVICE

(75) Inventors: Shigeo Itoh, Chiba (JP); Masateru Taniguchi, Chiba (JP); Masayoshi Nagao, Ibaraki (JP)

(73) Assignees: Futaba Corporation, Mobara-shi, Chiba-ken (JP); National Institute of Advanced Industrial Science and Technology, Tsukuba-shi, Ibaraki-ken (JP)

(*) Notice: Subject to any disclaimer, the term of this patent is extended or adjusted under 35 U.S.C. 154(b) by 0 days.

(21) Appl. No.: 11/593,794

(22) Filed: Nov. 7, 2006

(65) Prior Publication Data

US 2007/0103085 A1 May 10, 2007

(30) Foreign Application Priority Data

Nov. 10, 2005 (JP) ............................ 2005-326019

(51) Int. Cl.
*H01L 29/06* (2006.01)

(52) U.S. Cl. ................. 257/367; 257/10; 257/E21.001; 313/346; 313/373; 313/530; 313/541

(58) Field of Classification Search ..................... None
See application file for complete search history.

(56) References Cited

U.S. PATENT DOCUMENTS 5,153,483 A * 10/1992 Kishino et al. ................ 315/3
2002/0079802 A1* 6/2002 Inoue et al. ................ 313/309

FOREIGN PATENT DOCUMENTS

JP 03-295138 12/1991

* cited by examiner

*Primary Examiner*—A. Sefer
*Assistant Examiner*—Scott R Wilson
(74) *Attorney, Agent, or Firm*—Quarles & Brady LLP

(57) ABSTRACT

An image display device is provided in which the overall brightness of an image can be varied without adversely affecting hue and contrast. The image display device includes emitters 16 connected to a cathode electrode 15, a gate electrode 13, an anode electrode 3, transistors Tr1 and Tr2, and a capacitor 12. A voltage applied to the capacitor 12 is varied to display an image. A constant voltage is applied to the gate electrode 13 to change a time ratio Du. Thus, the overall brightness of an image can be adjusted.

7 Claims, 6 Drawing Sheets

-PRIOR ART-

-PRIOR ART-

FIELD EMISSION DISPLAY DEVICE

BACKGROUND OF THE INVENTION

The present invention relates to an image display device, and more particularly to an image display device of a field emission type.

Recently, attention has been directed to FEDs (Field Emission Displays), as a flat image display device. Many researches have also been conducted as to FED drive circuits. An active matrix system using active elements, for example, disclosed in Japanese patent publication No. 2656843 (patent document 1), is well known FED drive circuit.

An active matrix system, shown in FIG. 5, includes a thin-film transistor (TFT) section 1, a cathode section (FEC section), which has cone-shape emitters 16, a cathode electrode 15 connected to the cone-shape emitters 16, a gate electrode 13 having a large number of holes 13*a*, and an anode electrode 3 acting as a display substrate and having a surface on which a fluorescent substance layer 5 is coated. The thin-film transistor section 1 includes transistors Tr1 and Tr2. A drain 8 of the transistor Tr1 is connected to the emitters 16 via the cathode electrode 15. A gate 11 of the transistor Tr1 is connected to a source 7*a* of the transistor Tr2. A capacitor 12 is connected to the gate 11 of the transistor Tr1, a scanning signal is applied to a gate 11*a* of the transistor Tr2, and a clear signal or a display signal is selectively input to a drain 8*a*. This structure allows current magnitude to be controlled which flows from the drain 8 to the source 7, more specifically, which flows from the gate electrode 13 to the emitter 16 adjacent to the gate electrode 13 due to field electron emission. Although a plurality of emitters 16 are connected to each cathode electrode 15 in FIG. 5, a single emitter 16 may be connected to each cathode electrode.

The TFT array, which is formed of a plurality of thin-film transistors having the same configuration as the thin-film transistor section 1 formed on a substrate, is selected each array driving column in time sharing manner. At the same time, a matrix drive is carried out in sync with the time sharing operation to supply a display signal to each column in the array. Since each thin-film transistor section 1 in the TFT array is connected to each FEC array formed of a plurality of FEC sections having the same configuration as the FEC section, a capacitor voltage of a specific thin-film transistor section is selectively updated. Electrons are emitted due to field electron emission according to the voltage of the capacitor. In the operation, since the other capacitors in the TFT array maintain a present voltage until the voltage of the capacitors are next updated, electrons are continuously emitted from each FEC section during the maintenance of present voltage according to the voltage of each capacitor. In this case, the voltage of the gate electrode 13 is kept at a higher fixed level than that of the cathode section (FEC section).

A fluorescent substance layer 5 is coated over one or plural anode electrodes formed on a display substrate and an anode voltage is applied to the anode electrodes. Electrons emitted from each FEC section impinge on an opposed portion of the fluorescent substance layer to generate luminescence. The opposed portion of the fluorescent substance layer continues to produce luminescence at the same brightness until the capacitor voltage is next updated. A luminous time ratio (duty ratio) is to be approximately 1 so that a high intensity luminescence can be realized.

FIG. 6 shows a structure of the thin-film transistor section 1 and the cathode section. A cross section diagram of the transistor Tr1, which is a portion of the thin-film transistor 1 formed on a substrate, is shown on the left side of FIG. 6. The emitters 16 and the cathode electrode 15 connected to the emitters 16 in the cathode section are shown on the right side of FIG. 6. The source 7 and the drain 8 are formed on a glass cathode substrate 6 made of an electrical insulating material. A polycrystalline silicon semiconductor layer 9 is coated to bridge the source 7 and the drain 8. A gate insulating film 10 such as $SiO_2$ is deposited on the semiconductor layer 9 to form a gate 11. Thus, a transistor Tr1 is formed. A lead for the gate insulating film 10 and a lead for the drain 8 extend to the FEC section on the cathode substrate 6 so that the cathode electrode 15 is formed. The emitters 16 are connected to the cathode electrode 15. The lead for the source 7 is grounded (not shown). The lead for the source 7 and the lead for the gate 11 are laminated via an insulating layer, whereby a capacitor 12 is formed in this area. The lead for the gate 11 is connected to the source 7*a* of the transistor Tr2 via a lead line.

As described above, the active matrix system known in the art is to adapt such a matrix driving method that each column of the TFT array is selected in time sharing manner and a display signal as a capacitor charging voltage is applied to each row in the array while a constant dc voltage is applied to a gate electrode in the configuration including TFT arrays acting as active elements.

In the active matrix system, the luminous intensity of the fluorescent substance layer depends on the voltage of each capacitor in principle as described above. However, when an overall brightness of an image displayed on a flat image display device or a brightness of a partial area of an image divided into several sections is required to change according to an ambient environment, it has been difficult to establish a condition to change the brightness only without significantly changing hue and contrast, because voltages applied on respective capacitors must be controlled depending on the overall brightness, which makes such control to be very difficult.

SUMMARY OF THE INVENTION

The present invention is to provide an image display device for solving the above-mentioned problems. The image display device includes field emission elements, which can easily change an overall or parts of brightness of an image without adversely affecting hue and contrast.

According to the present invention, an image display device, comprises a substrate having an insulating material; emitters connected to each of a plurality of cathode electrodes formed on the substrate; a gate electrode disposed adjacent to the emitters; an anode electrode having a fluorescent substance layer which generate luminescence due to collision of electrons emitted from each of the plurality of emitters; a plurality of cathode current control elements formed on the substrate and having a cathode current control power terminal and a cathode current control terminal, wherein the cathode current control power terminal is connected to each of the plurality of cathode electrodes, the cathode current control terminal controls current passing through the cathode current control power terminal; a plurality of capacitors respectively connected to each of the plurality of cathode current control terminals to hold a voltage corresponding to an amount of electron emission; a plurality of capacitor voltage control power elements having a capacitor voltage control power terminal, a first capacitor voltage control terminal, and a second capacitor voltage control terminal, the capacitor voltage control power terminal being connected to each of the plurality of capacitors, the first capacitor voltage control terminal being mutually connected in a first group to set a voltage held in each of the plurality of capacitors, the second capacitor voltage control terminal being mutually connected in a second group to set some of the plurality of capacitors to keep a voltage corresponding to the amount of electron emission; and a gate electrode control circuit for applying a signal to the gate electrode, wherein the signal has a time rate, or a rate of time a constant voltage is applied repetitively, which is changeable.

The image display device includes a substrate having an insulating material, a plurality of emitters formed on a substrate and connected to a cathode electrode, and a gate electrode disposed adjacent to said emitters. This configuration allows each emitter to emit electrons when a voltage is applied between the gate electrode and the cathode electrode.

A plurality of cathode current control elements, a plurality of capacitors, and a plurality of capacitor voltage control power elements may be formed on the substrate. Each of the plurality of cathode current control elements has a cathode current control power terminal and an emitter voltage control terminal. Each of the plurality of cathode electrodes is connected to each cathode current control power terminal. Each of the plurality of emitter voltage control terminals is connected to each of the plurality of capacitors. Thus, each emitter can emit an amount of electrons corresponding to a voltage kept in each capacitor. Electrons emitted from each emitter flow as an anode current into the anode electrode and then the same amount of the current flows as a cathode current out the cathode electrode.

Moreover, a capacitor voltage control power element may be disposed to set a voltage kept in each of capacitors. Each of the plurality of capacitor voltage control power elements includes a capacitor voltage control power terminal, a first capacitor voltage control terminal, and a second capacitor voltage control terminal. Each of capacitor voltage control power terminals is connected to each of capacitors and each of the first capacitor voltage control terminals is mutually connected in a first group. Thus, a voltage to be kept in a capacitor can be determined. Each of the second capacitor voltage control terminals is mutually connected in second groups to set which of the plurality of capacitors to keep a voltage. Here, a control is conducted by grouping into first group and second group. Thereby, the voltages of capacitors, which correspond to the product of the number of capacitor voltage control terminals belonging to the first group and the number of capacitor voltage control terminals belonging to the second group, can be controlled with control signals, which corresponds to the sum of the number of capacitor voltage control terminals belonging to the first group and the number of capacitor voltage control terminals belonging to the second group.

Moreover, in the signal to be applied to the gate electrode, its time ratio, being a ratio of time during which a constant voltage is applied repetitively, may be changed. The image display device includes a gate electrode control circuit that generates such signals. While the gate electrode control circuit applies a voltage of a constant level to a gate electrode in a period according to a time ratio, the amount of electron emission from the emitter corresponding to the gate electrode can be controlled according to the value of the time ratio. Hence, the brightness of a screen can be adjusted broadly and accurately by just controlling the signal with respect to the gate electrodes.

Another aspect of the present invention, an image display device comprises a substrate having a insulating material; emitters connected to each of plurality of cathode electrodes formed on the substrate; a gate electrode disposed adjacent to the emitters; an anode electrode having a fluorescent substance layer thereon, which produces luminescent due to collision of electrons emitted from each of the plurality of emitters; a plurality of first cathode current control elements formed on the substrate and having a first cathode current control power terminal connected to each of the plurality of cathode electrodes, a second cathode current control power terminal for passing through a current from the first cathode current control power terminal, and a first cathode current control terminal for controlling current passing through between the first cathode current control power terminal and the second cathode current control power terminal, a plurality of first cathode current control elements including each of the second cathode current control power terminals being connected mutually in a first group, each of the first cathode current control terminals being connected mutually in a second group; a second cathode current control element including a second cathode current control terminal for controlling current passing through the second cathode current control power elements connected mutually to the first group; a selection signal generation circuit for applying a selection signal to one of the first cathode current control terminal and the second cathode current control terminal, the selection signal conducting a cathode current control element belonging to a corresponding group; a control signal generation circuit for applying a control signal to the other of the first cathode current control terminal and the second cathode current control terminal, the control signal controlling current flowing a cathode current control element belonging to a corresponding group; and a gate electrode control circuit for applying a signal to the gate electrode, wherein the signal of which a time ratio, or a ratio of time a constant voltage is applied repetitively, changes.

This image display device includes a substrate having an insulating material, plural emitters formed on the substrate and connected to a cathode electrode, and a gate electrode disposed adjacent to said emitters. This configuration allows each emitter to emit electrons when a voltage is applied between the gate electrode and the cathode electrode.

A plurality of first cathode current control elements and a plurality of second cathode current control elements are formed on a substrate. Each of the first cathode current control elements includes a first cathode current control power terminal connected to each cathode electrode, a second cathode current control power terminal for passing through current from the first cathode current control power terminal, and a first cathode current control element for controlling current passing through between the first cathode current control power terminal and the second cathode current control power terminal. Respective second cathode current control power terminals are mutually connected in a first group. Respective first cathode current control power terminals are mutually connected in a second group. Moreover, the image display device includes a second cathode current control element having a second cathode current control terminal, which controls current passing through each of the second cathode current control power elements mutually connected in a first group.

Moreover, the image display device may include a selection signal generation circuit that outputs selection signals and a control signal generation circuit that outputs control signals. The selection signal generation circuit inputs a selection signal for conducting a cathode current control element belonging to the first group, to one of the first cathode current control terminal and the second cathode current control terminal. The control signal generation circuit outputs a control signal for controlling current flowing a cathode current control element belonging to the corresponding group, to the other of the first cathode current control terminal and the second cathode current control terminal, that is, to the other of the first cathode current control terminal and the second cathode current control terminal, to which a selection signal is not applied.

The signal applied to the gate electrode corresponds to a signal, of which time ratio, or the ratio of time which a constant voltage is applied repetitively is to be changeable. A gate electrode control circuit is provided that generates such a signal. A voltage of a fixed level is applied to a gate electrode for the time period according to the time ratio. The amount of electron emission from the emitter corresponding to the gate electrode can be controlled according to the value of the time ratio. Therefore, the brightness of a screen can be adjusted widely and accurately by just controlling the voltage applied to the gate electrode.

According to the present invention, an image display device can be provided that includes field emission elements, each of which the brightness of the overall or part of an image can be easily changed, without adversely affecting hue and contrast.

BRIEF DESCRIPTION OF THE DRAWINGS

This and other objects, features, and advantages of the present invention will be readily more apparent upon the following detailed description and drawings; wherein.

BEST MODE FOR EMBODYING THE INVENTION

Figure 1:
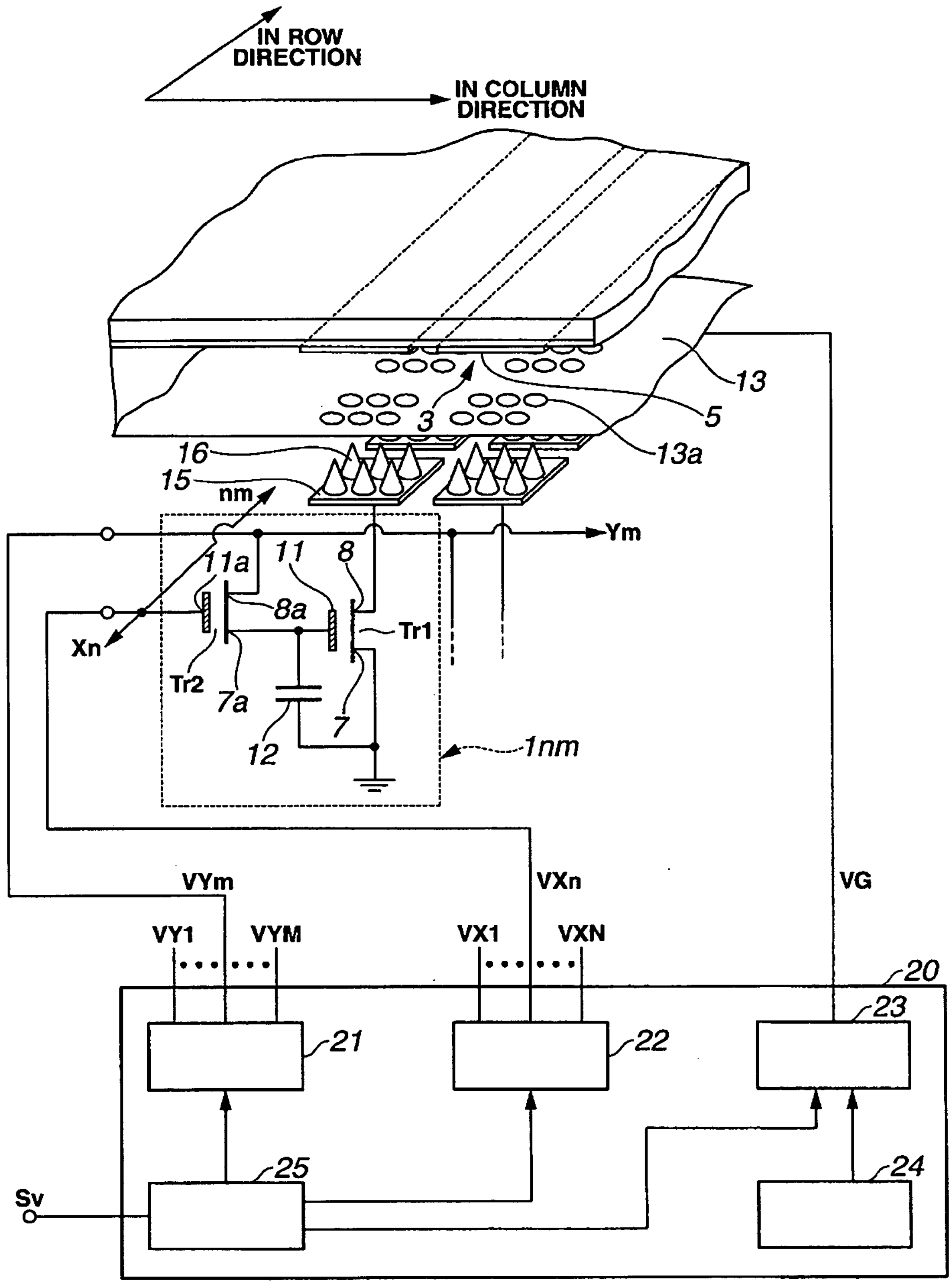
FIG. 1 is a schematic view showing a principal part of an image display device according to an embodiment of the present invention.

Now, a best embodiment in accordance with the present invention will be described below with reference to the accompanying drawings. FIG. 1 shows a main part of an image display device according to an embodiment. At the upper region of FIG. 1, a cathode section including a cathode electrode 15 and a gate electrode as main parts, which are related to electron emission and control of an image display device, and a structure of an anode electrode 3 are schematically shown. The cathode electrode 15*nm* represents one cathode electrode 15 arranged in the n-th row and in the m-th column. The circuit configuration of a thin-film transistor section 1 is shown at the center of FIG. 1. The thin-film transistor section 1*nm* represents one thin-film transistor section 1 that drives the cathode electrode 15*nm*. An electrode control section 20 including a gate electrode control circuit 23 is shown at the lower portion of FIG. 1. Referring to FIG. 1, functions of respective portions will be explained below in more detail.

Figure 5:
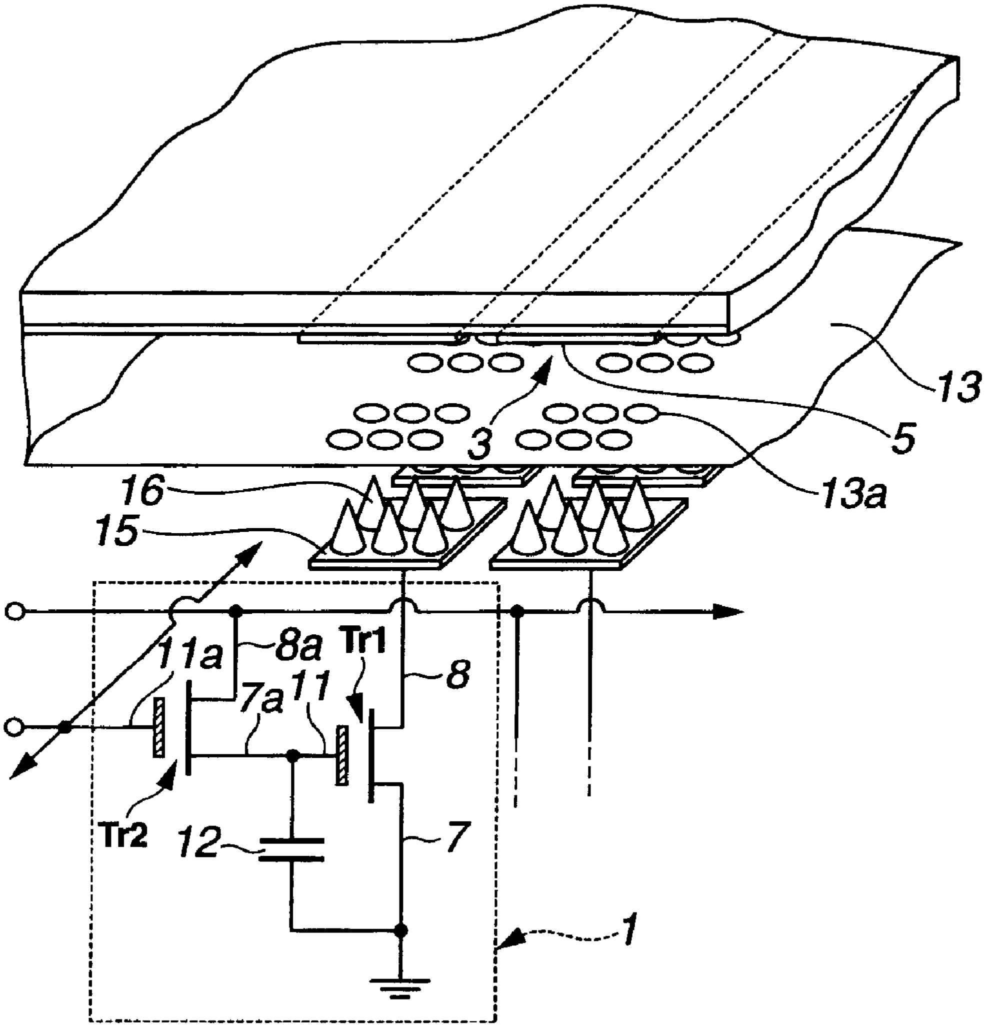
FIG. 5 is a schematic view showing a principal part of an image display device in a related art.
Figure 6:
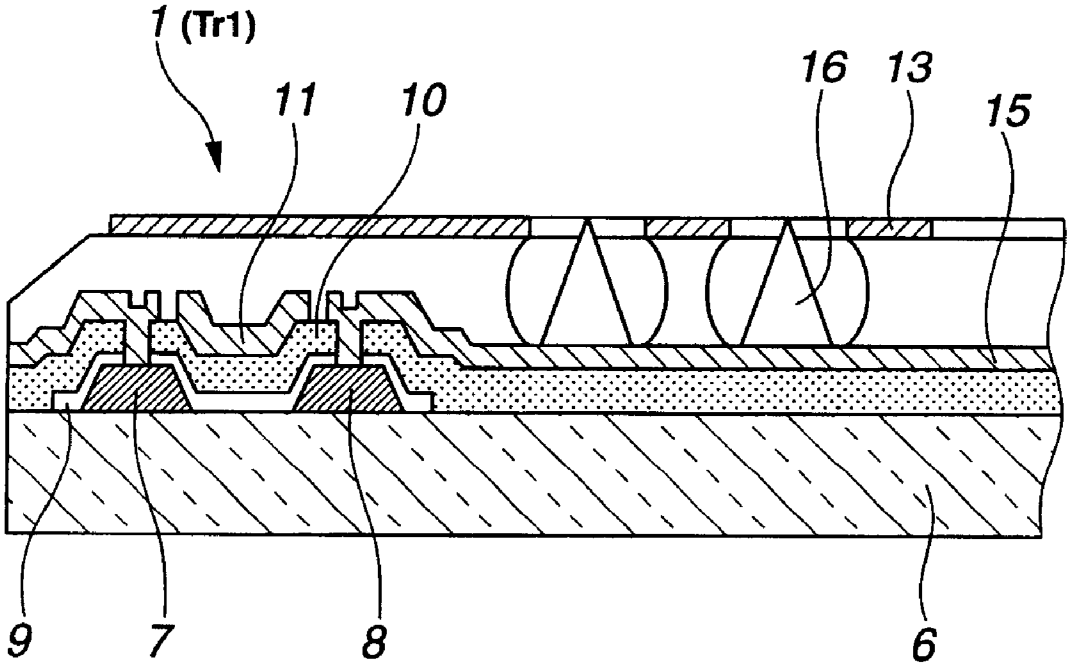
FIG. 6 is a sectional view showing the configuration of a principal part of an image display device in a related art.

The electrode configuration and the thin-film transistor section 1*nm*, shown in FIG. 1, are substantially the same as the configuration shown in FIGS. 5 and 6 as the background art. The electrode configuration comprises a plurality of cathode electrodes 15 each having the same structure as that of the cathode electrode 15*nm*, which has cone-shape emitters 16 and is connected to the cone-shape emitters 16, a cathode section (FEC section) including a gate electrode 13 having a large number of holes 13*a*, an anode electrode 3 acting as a display substrate, and a fluorescent substance layer 5. The cathode electrode 15*nm* represents a cathode in the n-th row and in the m-th column. The number of cathode electrodes is N in row direction and M in column direction. The total number of cathode electrodes is M×N. The cathodes are arranged over the substrate formed of an insulating material.

The gate electrode 13 is disposed adjacent to the emitters 16. A single sheet of gate electrode 13 may be disposed for one screen. However, a sheet of gate electrode may be divided into plural sections. For example, a sheet of gate electrode 13 may be divided into four sections, that is, two sections arranged vertically (in column direction) and two sections arranged horizontally (in row direction). Specifically, the gate electrode 13 may be divided into four gate electrodes, that is, a gate electrode 13A (not shown), a gate electrode 13B (not shown), a gate electrode 13C (not shown), and a gate electrode 13D (not shown). When the gate electrode 13 is divided into four sections to display different images (contents) respectively, the brightness can be controlled with respect to each of contents. Holes 13*a* are formed in the gate electrode 13 so as to oppose to cone-shape emitters 16 respectively. Each emitter 16 emits field-emitted electrons due to the electric field created between a peripheral portion of each of holes 13*a* and each emitter 16. The emitted electrons pass through the hole and strike the opposed surface of the anode electrode 3 on which a fluorescent substance layer 5 coated to produce luminescence.

The thin-film transistor section 1*nm* corresponds to a thin-film transistor formed on a substrate, as shown in the background art. Not only an insulating material but also a silicon wafer or a substrate formed of a conductive material coated with an insulating material may be used as the substrate. The thin-film transistor section 1*nm* includes a transistor Tr1 acting as cathode current control element. The transistor Tr1 has a drain 8 functioning as a cathode current control power terminal connected to each cathode electrode 15 and a gate 11 functioning as a cathode current control terminal controlling current passing through the drain. Each of the transistors Tr1 is connected to each of capacitors 12. Moreover, each of the thin-film transistor sections 1 includes a transistor Tr2 functioning as a capacitor voltage control power element. Each transistor Tr2 has a source 7*a* functioning as a capacitor voltage control power terminal connected to each capacitor 12, a drain 8*a* functioning as a first capacitor voltage control terminal for determining a voltage kept in each capacitor 12, and a gate 11*a* functioning as a second capacitor voltage control terminal for determining which of capacitors 12 to be kept in the voltage.

The drain 8 of the transistor Tr1 in the thin-film transistor section 1*nm* is connected to the cathode electrode 15*nm*. The gate 11 of the transistor Tr1 is connected to the source 7*a* of the transistor Tr2. A capacitor 12 is connected to the gate 11 of the transistor Tr1. The thin-film transistor section 1*nm*, shown in FIG. 1, corresponding to one factor of the thin-film transistor section 1, is connected to the cathode electrode 15. Similarly, other thin-film transistor sections 1 are connected to each of cathode electrodes 15, respectively. The total number of thin-film transistor sections 1 or cathode electrodes 15, which configure the image display device, is M×N. M×N corresponds to the number of pixels formed of a fluorescent substance.

Of the drains 8*a* of the transistors Tr2 of M×N, arranged in the thin-film transistor section 1, the drains of M in column row direction (a first group) are mutually connected together. The number in the first group is M. The drains of M mutually connected in the first group functions as a first capacitor voltage control terminal, which determines a voltage kept in each capacitor 12 corresponding to the amount of electron emission. Of the gates 11*a* of the transistors Tr2 of M×N arranged in the thin-film transistor section 1, gates 11 of N arranged in row direction (a second group) are mutually connected. The number in the second group is N. The gates of N mutually connected in the second group works as a second capacitor voltage control terminal, which determines whether or not a voltage of a specific one of capacitors 12 is updated (or is kept in the voltage). Thus, by dividing transistors into N groups in row direction and M groups in column direction, the anode current values (cathode current values) of respective pixels of M×N can be controlled with control lines (control information) of M×N.

The first group may be selected in row direction (not column direction) while the second group may be selected in column direction (not row direction). Moreover, the first group may be selected in an oblique direction (not in row direction and not in column direction). In such a case, when the second group is selected geometrically perpendicular direction to the oblique direction, the display content can be suitably rotated to a desired angle on the screen, provided that control information input to the control lines does not change. It is not required to orthogonalize the first group to the second group. Not only normal image display but also various trick images can be implemented by any selection of angle. This selection is carried out through previous mutual connection of gates 11*a* of transistors Tr2 and previous mutual connection of drains 8*a* and using the signal separation/drive signal generator 25 in the electrode controller 20 (to be described later). The term, "column direction" or "row direction" is not a word intending to indicate a specific direction in this specification. In the explanation of the present embodiment, the term "column direction" represents a direction of the force of gravity and the term "row direction" represents a direction perpendicular to the force of gravity. The technical concepts of the present invention are not influenced by any definition of the direction.

The anode electrode 3 formed on the display substrate is coated with a fluorescent substance 5. An anode voltage is applied to the anode electrode 3. Electrons emitted from each emitter 16 impinge the opposed portion of the fluorescent substance layer 5 to produce luminescence. The opposed portion of the fluorescent substance layer glows at the same brightness until the voltage of the capacitor 12 is updated. The time ratio (duty ratio) Du of luminescence is substantially to be 1 so that a high intensity luminescence can be obtained.

The relationship between the thin-film transistor section 1 and the cathode electrode 15 in the present embodiment is the same as that in the background art shown in FIG. 6. Explanation is made by again referring to FIG. 6. The cross-section diagram of the first transistor Tr1 of a thin-film transistor section 1 formed on a substrate is shown on the left side of FIG. 6. The emitters 16 and the cathode electrode 15 connected to the emitters 16 in the cathode section 1 are shown on the right side of FIG. 6. The source 7 and the drain 8 are formed on a cathode substrate 6 made of glass being an insulating material. A polycrystalline silicon semiconductor layer 9 is coated so as to bridge the source 7 and the drain 8. The gate insulating film 10 such as SiO2 is laminated over the semiconductor layer 9 to form the gate 11. Thus, the transistor Tr1 is formed. The lead for the gate insulating film 10 and the lead for the drain 8 extend to the FEC section above the cathode substrate 6 so that the cathode electrode 15 is formed. The lead for the source 7 is grounded (not shown). The lead for the source 7 and the lead for the gate 11 are laminated via an insulating layer, thereby the capacitor 12 is formed in the area. The lead of the gate 11 is connected to the lead of the previous transistor Tr2 via the source 7*a*.

In such an active matrix system, L represents luminous brightness (cd/m×m) and S represents anode area (m×m) and Va represents anode voltage and Ia represents anode current (A) (equal to cathode current) and Du represents time ratio (real number equal to or less than 1) and □ represents luminous efficiency of fluorescent substance (Lm/W), □ represents effective current efficiency (real number equal to or less than 1) and □ r represents light transmission efficiency of fluorescent substance (real number equal to or less than 1). The brightness L is represented by the (formula 1).

$$L=(Va\times Ia\times\square\times Du\times\square\times\square\ r)/(\pi\times S) \qquad \text{(Formula 1)}$$

As apparent from the formula (1), it is required to make the numerator larger and the denominator smaller to produce higher brightness. However, there are restrictions in each parameter. For example, the luminous efficiency of fluorescent substance □, the effective current efficiency □, and the light transmission efficiency of fluorescent substance □ r substantially depend on the type of an image display device. In the active matrix system shown in the background art, the time ratio Du is 1.

In the present embodiment, the system for controlling the time ratio Du of the voltage applied to the gate electrode 13 is employed as a new control method. That is, the time ratio Du is to be changeable by using the gate electrode control circuit 23 (to be described later). The voltage Va, or anode electrode voltage, has a limited level because it cannot exceed the maximum voltage (withstanding voltage) between the anode electrode 3 and the cathode electrode 15. Moreover, the current Ia, or current flowing the anode electrode 3 (equal to the current flowing the cathode electrode), is specified in principle by the potential difference between the voltage VY applied to N drains mutually connected in a first group and the voltage VG of the gate electrode 13. When the voltage VG of the gate electrode 13 is fixed, the current Ia flowing the anode electrode 3 (equal to the current flowing the cathode electrode) is controlled with the voltage VY.

When the brightness of the image display device is changed under the above-mentioned conditions, the voltage VY, or the drain voltage of the transistor Tr2 in the first group, and the voltage VX, or the drain voltage of the transistor Tr2 in the second group are controlled, so that the voltage VC kept in each capacitor 12 is changed. The control of the time ratio Du will be described later.

Figure 2:
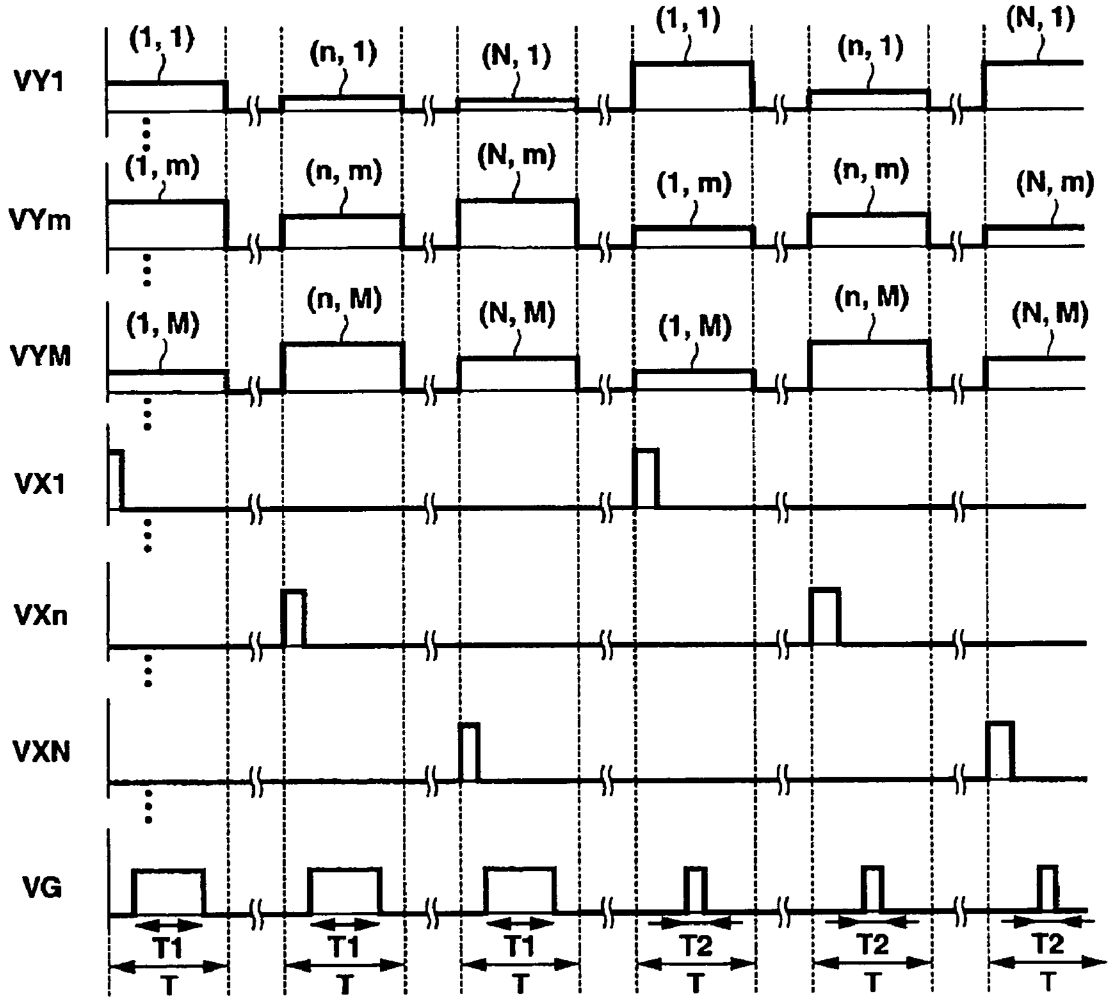
FIG. 2 shows a timing chart showing an operation of an image display device according to the present invention.

FIG. 2 is a timing chart showing difference of how to apply the voltage VY and voltage VX. In FIG. 2, a longitudinal axis represents voltages. FIG. 2 shows only the voltage VY1 corresponding to the first column in the first group (corresponding to each of the first to N-th rows, but showing first, n-th, and N-th columns in FIG. 2), the voltage VYm corresponding to the m-th column in the first group, and the voltage VYM corresponding to the M-th column in the first group. Other voltages are omitted here. A transverse axis represents time axis. FIG. 2 shows only the voltage VX1 corresponding to the first row in the second group, the voltage VXn corresponding to the n-th row in the second group, and the voltage VXN corresponding to the N-th row in the second group and others are omitted here as described above.

For example, when the voltage VX1 becomes a high level (an upper potential in FIG. 2), values corresponding to voltages VY1, VYm, and VYM and other voltages in other first group (values corresponding to (1,1), (1,m) and (1,M) in FIG. 2) are sampled. When the voltage VX1 becomes a low level (a lower potential in FIG. 2), these values are held in each capacitors 12. That is, the voltage VC of the capacitor 12 disposed in each thin-film transistor section 1 is updated and held. By doing so, the voltages of the emitters 16 in the column direction in the first row, for example, are determined and scanned horizontally. The second row in the next second group is scanned similarly. The n-th row shown in FIG. 2 (corresponding to (n,1), (n,m), (n,M) in FIG. 2) is scanned. Finally, the N-th row (corresponding to (N,1), (N,m), (N,M) in FIG. 2) is scanned. Then, the first row is scanned again. When the voltage VG applied to the gate electrode 13 is continuously maintained at a predetermined constant voltage, an image having a predetermined brightness is to be visible due to the fluorescent substance layers 5 in the image display device.

Figure 3:
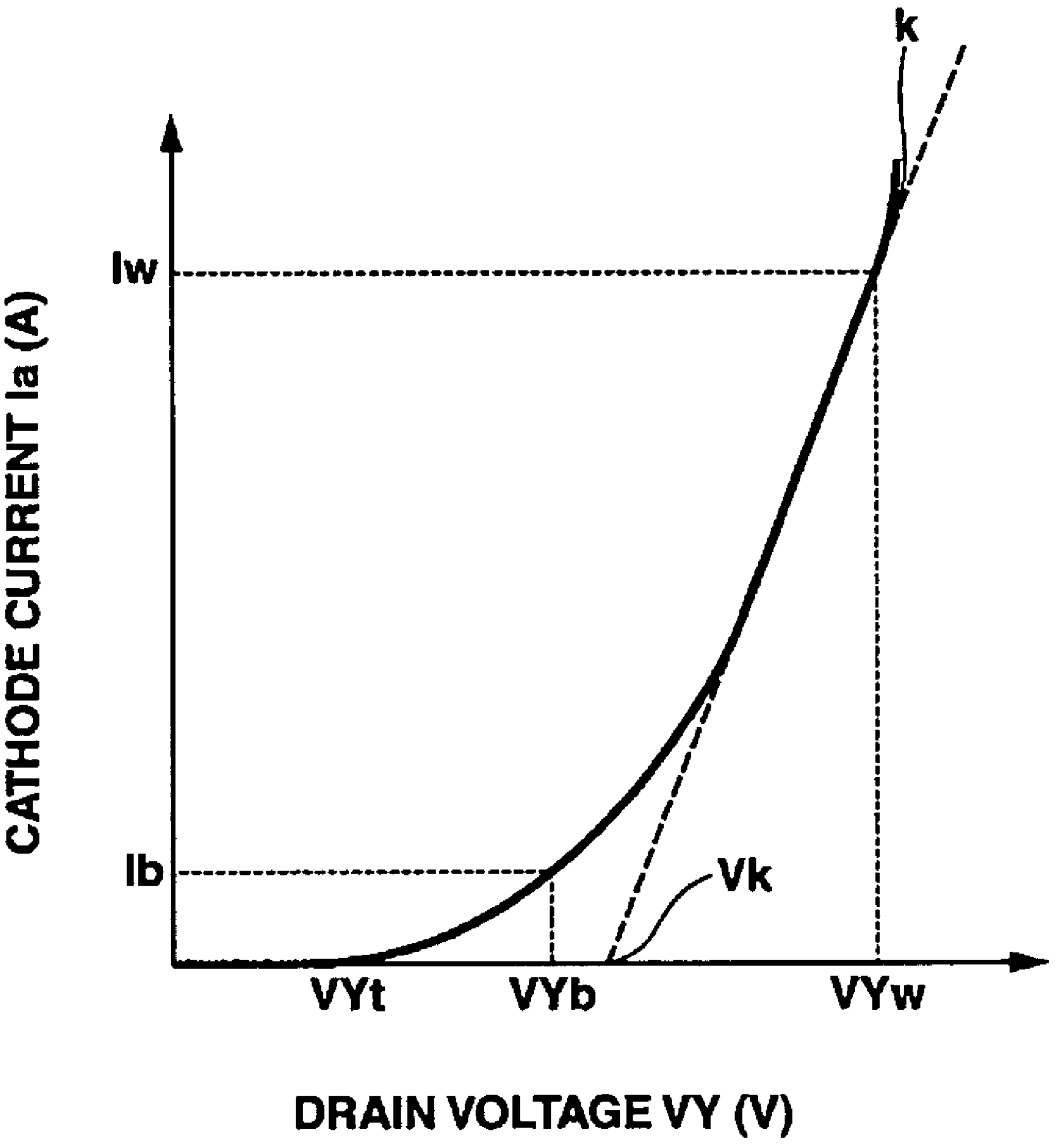
FIG. 3 is a plotting diagram showing a relationship between drain voltage and cathode electrode current in a transistor.

FIG. 3 shows the relationship between voltage VY (drain voltage) (where voltages VY1 to VYM are generically referred to as voltage VY) of a transistor Tr2 and current Ia (anode current), when the gate electrode 13 is kept at a predetermined constant voltage. When the voltage VY reaches a threshold voltage VYt, electron emission begins. When the current Ia reaches current Ib at the voltage VYb, the fluorescent substance glows at a brightness of a black color level. When the current Ia reaches current Ib at the voltage VYw, the fluorescent substance glows at a brightness of a white color level. Each of the black color level and the white level is a predetermined brightness. For example, the black color level is a minimum brightness, in which emission of light can be recognized visually. The white color level is a maximum brightness restricted by considering the operational life or the like of the fluorescent substance layer 5. FIG. 3 shows the characteristic of a single cathode electrode 15, for example, cathode 15*nm*. Cathode electrodes 15 arranged in M×N in the image display device, have different characteristics, respectively. The variation in characteristic results from variations, such as differences of transistor Tr1, transistor Tr2, capacitor 12, and distributions of electrical field intensity caused by the structures of emitters 15 disposed on cathode electrode.

Next, as electrode control section 20 shown in FIG. 1 will be explained. The electrode control section 20 includes a signal separation/drive signal generator 25, a drain drive circuit 21, a gate drive circuit 22, a gate electrode control circuit 23, and an optical sensor 24.

The signal separation/drive signal generator 25 receives a composite picture signal Sv and generates a horizontal synchronous signal, a vertical synchronous signal, and a picture signal. The signal separation/drive signal generator 25 outputs voltages from VY1 to VYM, which are picture signals arranged in row direction flowing in column direction, to the drain drive circuit 21 based on the horizontal synchronous signal. The drain drive circuit 21, which is a power amplifier circuit, generates a power for driving the drain 8*a* of each of transistors Tr2. The signal separation/drive signal generator 25 outputs the voltages from VX1 to VXN for determining as to which of the rows arranged in column direction respectively to the gate drive circuit 22, based on the vertical synchronous signal. Each of the voltages from VX1 to VXN is a voltage for turning on or off a channel between a drain and source of the transistors Tr2. When the voltage is to be at a high level, the channel between the drain and source of the transistor Tr2 is turned ON, whereas when the voltage is to be at a low level, the channel is turned OFF. The gate drive circuit 22, which is a power amplifier circuit, generates the power for driving the gate electrode 11*a* of each transistor Tr2. The signal separation/drive signal generator 25 produces a first gate control signal to the gate electrode control circuit 23. The optical sensor 24 produces a second gate control signal to the gate electrode control circuit 23. The first gate control signal and the second gate control signal will be explained later.

As to the image display device having the above-mentioned configuration, a representative example of a novel system for driving the gate electrode 13 incorporated in the present embodiment, will be explained below.

First Embodiment

The waveform of a voltage applied to the gate electrode 13 in the first embodiment is a repetitive waveform, similar to that in other embodiments to be described later. That is, a voltage applied to the gate electrode 13 is set to a constant value enabling field emission for a period during one cycle. A voltage disenabling field emission is applied to the gate electrode 13 for the remaining period during the cycle. With one cycle defined as a ratio of 1, the time ratio Du ranges from 0 to 1. That is, during a time corresponding to the time ratio Du, or during a time represented by the product of one cycle time multiplied by the time ratio Du, the voltage applied to the gate electrode 13 allows the emitters 16 to generate the field emission. During the remaining period in one cycle, the voltage applied to the gate electrode 13 is set to suppress the field emission from the emitter 16. In the first embodiment, when the time ration is 1, voltages from VY1 to VYM, which make a luminous brightness of a screen in a white color level, are output to the drain drive circuit 21. By doing so, the brightness of the whole of an image can be easily changed by varying the time ratio Du over 1 to 0 without adversely affecting hue and contrast.

Second Embodiment

In the control method in the first embodiment, it may be sometimes difficult, due to variations in radiation characteristic of each FEC section, to control the brightness under only the control of the voltage from VY1 to VYM. For example, even if all the voltages from VY1 to VYM are set at the same value in the low brightness region, a certain FEC section often emits electrons sufficiently so that the light emission is recognized visually, but another certain FEC section does not. This disadvantage occurs because of characteristic errors of each transistor, variations in magnitude of leakage current caused in each capacitor, and the like. When variations in brightness occur in each of portions (pixels) on the display screen, the variations must be often corrected in each case. The second embodiment was implemented in consideration of the above-mentioned problems. FIG. 3 plots a relationship between voltage VY applied to the drain of the transistor Tr2 and current Ia flowing the corresponding portion of the anode electrode 3 (that is, current Ia flowing each cathode electrode 15). It is statistically known that variations in the current Ia flowing each cathode electrode 15 decreases in large regions of voltage VY. That is, this relationship is given by the formula (2). It has been revealed statistically that the standard deviation value Nv1 at the voltage VY1 indicating a relatively large range is smaller than the standard deviation value Nv2 at the voltage VY2 indicating a relatively small range. Var abbreviates obtaining, for pixels of N×M, a standard deviation of the current Ia when the voltage VY is at a fixed value.

$$Nv1=\mathrm{Var}(Ia1ij)$$

$$Nv2=\mathrm{Var}(Ia2ij) \qquad \text{(Formula 2)}$$

Therefore, when the whole of the screen is illuminated at a low brightness, images with more improved quality can be obtained by the control where the time ratio Du is decreased on application of the voltage VG of the gate electrode 13 and the voltage VY is increased, compared with the control where a dc (constant) voltage VG is applied to the gate electrode 13 (the time ratio Du of 1) and the voltage VY is reduced. For that reason, when the voltage VG is continuously applied (the time ration is 1), the voltage VG is set to a voltage at which the brightness of the fluorescent substance layer exceeds the white color level. The time ratio Du is set to a value at which the brightness of the fluorescent substance layer 5 does not exceed the white color level. By doing so, a good image quality can be obtained. For example, in the case of a dc voltage (the time ratio is 1), the voltage VG that can flow twice the current Iw corresponding to the white level is previously applied and the time ratio Du is set to 0.5. Thus, structural variations of the transistors Tr1 and Tr2, capacitors 2, and the emitters 16 disposed on the cathode electrode are suppressed. Thus, better images can be obtained.

In such a case, when the voltage VG is fixed at a large value and the time ratio Du is adjusted over 0 to 0.5, good control can be obtained through control of the time ratio Du. That is, when the luminous efficiency is low, the time ratio Du is set to a small value, so that the effect of small variations can be maintained. Moreover, since the absolute value of variation becomes small proportional to a decrease of the time ratio Du, such control allows a good screen quality to be obtained.

In a specific example of performing the above-mentioned brightness adjustment, the optical sensor 24 detects an ambient brightness. When the ambient area is dark, the time ratio Du of the voltage VG of the gate electrode 13 is decreased. When the ambient area is bright, the time ratio Du of the voltage VG is increased. In such an operation, the brightness of the whole of an image can be easily adjusted without adversely affecting hue and contrast. In FIG. 2, a large time ratio Du of the voltage VG of the gate electrode 13 is represented with the pulse width T1 while a small time ratio Du thereof is represented with the pulse width T2. The voltage VG of a predetermined value is applied only for the time duration corresponding to the pulse width T1 or T2. In other time, the voltage VG is set to zero. The time ratio Du of one periodic width T to the pulse width T1 is T1/T while the time ratio Du of one periodic width T to the pulse width T2 is T2/T.

The gate electrode 13 may be divided into plural portions and respective divided portions may display different images, respectively. For example, the screen in the range covered by the gate electrodes 13A may receive a broadcast of baseball or the screen in the range covered by the gate electrodes 13B may receive a broadcast of news. In such a configuration, by differently setting the time ratio Du of the voltage VG of the gate electrode 13A and the time ratio Du of the voltage VG of the gate electrode 13B, one screen can be easily adjusted in a relatively dark state.

Alteration of Second Embodiment

In the adjustment of the time ratio Du, an operator of the image display device may manually control the time ratio Du to obtain desired image brightness. However, the time ratio Du may be controlled in various other methods. For example, the time ratio Du of the voltage VG is controlled with the first gate control signal from the signal separation/drive signal generator 25. The optical sensor 24 detects the ambient brightness. The voltage VG may be controlled using the second gate control signal based on information from the optical sensor 24. Alternatively, the voltage VG may be controlled with the first gate control signal and the time ratio Du may be controlled with the second gate control signal. Thus, the control of voltage Vg may be performed together with the control of time ratio DU.

Third Embodiment

The signal separation/drive signal generator 25 includes a RAM (Random Access Memory) (not shown). The signal separation/drive signal generator 25 can absorb variations in the current Ia, flowing through the anode electrode 3, with respect to the voltage VY, for each cathode electrode 15. As shown in FIG. 3, the relationship between the current Ia and the voltage VY is linear. The voltages VYt, VYb, and VYw fluctuate, respectively. That is, the shape of the characteristic curve, shown in FIG. 3, depends on every cathode electrode 15. Therefore, even if the variation width of the current Ia with respect to the voltage VY is equalized to some extent in the narrow region, it is very difficult to equalize the characteristics in all regions using the RAM. In the present embodiment, variations in structure of the transistors Tr1 and Tr2, the capacitor 12, and the emitter 16 disposed on the cathode electrode and variations of the fluorescent substance layer 5 are absorbed using the RAM, as described below.

Referring to FIG. 2, since the relationship between the current Ia and the voltage VY is nearly linear in the relative narrow region near to the white level is substantially linear, it can be approximated by the formula (3). The formula (3) is held for the voltage VYj of the transistor Tr2 in the thin-film transistor section 1 and the cathode electrode 15 corresponding to the i-th row and the j-th column. [kij] is a matrix of the i-th row and the j-th column. The coefficient kij, being a factor, indicates the gradient k of the broken line shown in FIG. 3. [Vkij] is a matrix of the i-th row and the j-th column. The coefficient Vkij indicates an offset voltage Vk being the voltage at the point where the broken line intersects with the abscissa axis. [VYj], or a column vector, represents the voltage applied to the drain 8*a* of the transistor Tr2 belonging to each column.

$$[Iaij]=[kij]\times[VYj]-[Vkij] \qquad \text{(Formula 3)}$$

The formula (3) represents each current Iaij with respect to a predetermined voltage VY. If the voltage VY is corrected, each current Iaij can be set to a constant value with no variations. That is, it is considered to conduct the process based on the formulas (3) and (4). [Lij] is a matrix previously obtained to equalize each current Iaij when the same voltage is applied the drains 8*a* of the transistors Tr2 belonging to each column.

$$[VYnj]=([Lij])([Ia]+[Vkij])=[knij]([Ia]+[Vkij]) \quad \text{(Formula 4)}$$

Provided that the value of matrix [knij] and the value of matrix [Vkij], having (M×N) factors, are previously obtained, the characteristic changes can be easily absorbed using the conversion formula (2). In this case, The RAM stores coefficients of 2×M×N.

If the factor of variations in brightness of the fluorescent substance layer 5 is put into the formula (4), variations in electron impingement effect and variations in a fluorescent substance luminous efficiency □, and variations in a fluorescent substance light transmission efficiency □ r can be absorbed. As a result, variations in brightness can be further reduced. The signal separation/drive signal generator 25 computes the conversion formula (4) and controls the gate electrode control circuit 2 with the second gate control signal.

As described above, while the voltage conversion operation is being conducted, the control of the gate electrode 13 is conducted, as shown in the second embodiment. That is, the brightness in the low brightness region is adjusted by controlling the time ratio Du of the voltage VG. For example, when the time ratio Du of the voltage VG applied to the gate electrode 13 is halved, the brightness L is halved without controlling the voltage VY1 to VYM, as apparent from the formula (1). By varying the time ratio Du of the voltage VG, the brightness can be controlled completely proportionally and very preferably. In other words, When the whole of the screen glows in low brightness, the time ratio Du is set to a small value and the voltage VY between the gate electrode 13 and the cathode electrode 15 is increased. This operation can compress variations due to differences in electric field strength distribution based on the structure of the transistors Tr1 and Tr2, the capacitor 12, and the emitter 16 disposed on each cathode electrode. This simple circuit configuration allows images with good quality.

Moreover, in an example like the second embodiment, the optical sensor 24 detects an ambient brightness. In the case of the dark state, the time ratio Du of the voltage VG of the gate electrode 13 is set to a small value. In the case of the bright state, the time ratio Du of the voltage VG is set to a large value. Thus, the brightness of the whole of an image can be easily changed without adversely affecting hue and contrast.

Fourth Embodiment

Figure 4:
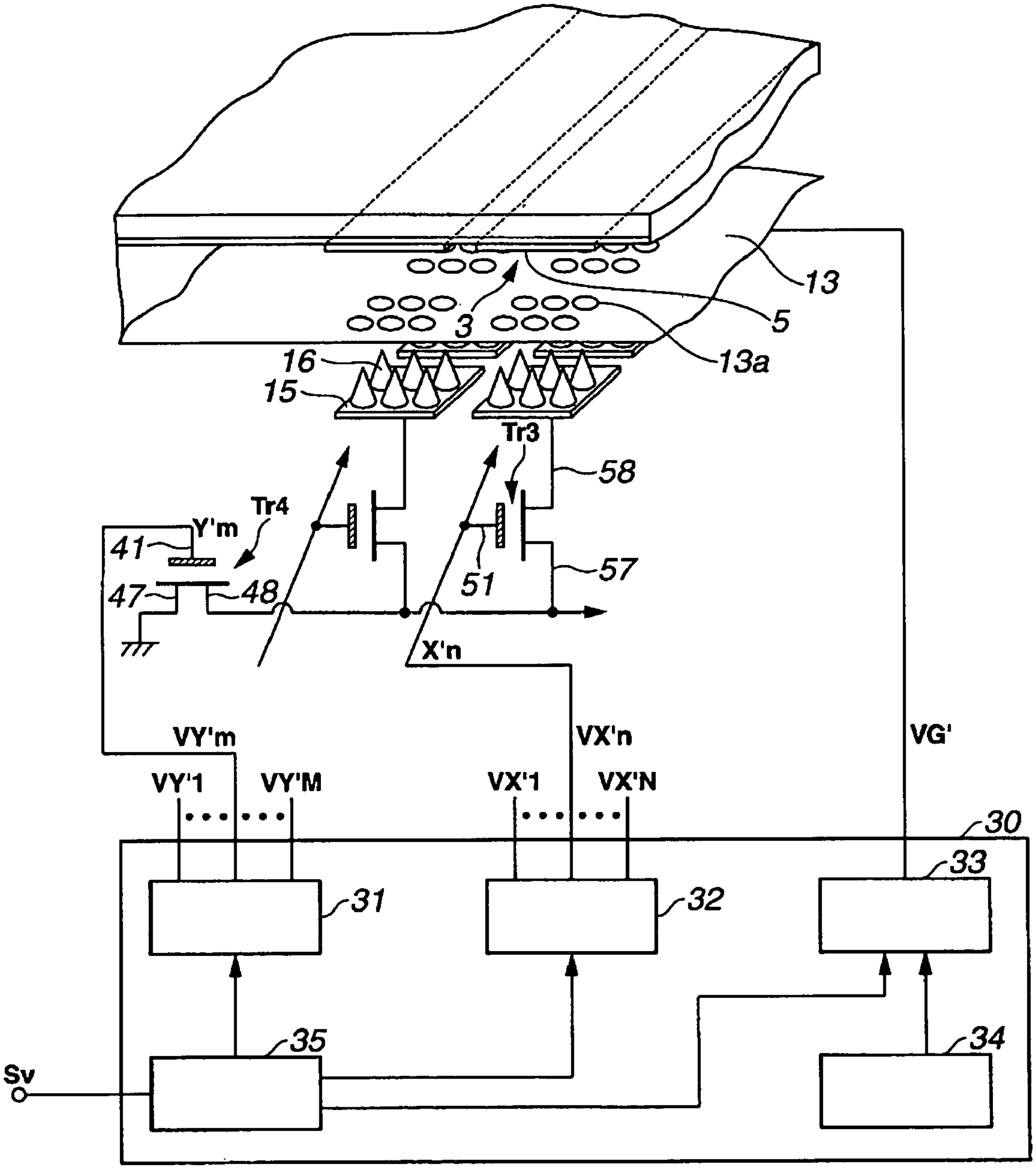
FIG. 4 is a schematic view showing a principal part of an image display device according to an another embodiment of the present invention.

An image display device in a fourth embodiment will be explained by referring to FIG. 4. Like reference numerals are attached to the same elements as those in the first, second, and third embodiments. Hence, duplicate explanation will be omitted. The fourth embodiment includes a substrate having an insulating material (not shown in FIG. 4 and refer to FIG. 6), emitters 16 connected to each of plural cathode electrodes 15 formed on the substrate, a gate electrode 13 disposed adjacent to the emitter 16, and an anode electrode 3 having a fluorescent substance layer 5 which glows due to impingement of electrons emitted from each emitter 16. Plural transistors Tr3, each acting as a first cathode current control element, are formed on the substrate. Each transistor Tr3 has the drain 58 acting as a first cathode current control power terminal connected to each cathode electrode 15, the source 57 acting as a second cathode current control power terminal conducting the current from the drain 58, and the gate 51 acting as a first cathode current control terminal which controls current passing the channel between the drain 58 and the source 57. The sources 57 of the transistors Tr3 are mutually connected in a certain row direction being an example of a first group and are connected to the drain 48 of the transistor Tr4. The source 47 of the transistor Tr4 is grounded. The gates 51 of transistors Tr3 are mutually connected in a certain column direction being an example of a second group. A transistor Tr4, acting as a second cathode current control element in which current passing the transistor Tr3 is controlled by the gate 41 being a second cathode control element, is provided to each of the sources 57 mutually connected in the row direction.

Moreover, the electrode controller 30 includes a signal separation/drive signal generator 35 (equivalent to the signal separation/drive signal generator 25), a control signal generation circuit 31 (having the same function as the drain drive circuit 21), a selection signal generation circuit 32 (equivalent to the gate drive circuit 22), and an optical sensor 34 (equivalent to the optical sensor 24). The voltages VX'1 to VX'N, each being a selection signal for conducting the source 57 of each transistor Tr3 belonging to the corresponding column, are respectively applied to the gates 51 of transistors Tr3 belonging to each row in the row direction. The selection signal generation circuit 32 generates the selection signal. The voltage VY'1 to VY'M, each being a control signal for controlling current flowing each transistor Tr3 belonging to the corresponding row, are respectively applied to the gates 41 of the transistors Tr4. The control signal generation circuit 31 generates the control signal. FIG. 4 partially depicts only the row of Y' m and the column of X'n and other portions are omitted. The voltage VX'1 or VX'M, which is generated by the selection signal generation circuit 32, (in this case, N is changed to M) may be applied to the gate 41 of the transistor Tr4. The voltage VY'1 or VY'N, which is generated by the control signal generation circuit 31, (in this case, M is changed to N) may be applied to the gate 51 of the transistor Tr3. By doing so, the same effect can be obtained.

Moreover, the present embodiment includes a gate electrode control circuit 33, having the same function as the gate electrode control circuit 23, for changing the time ratio Du being the ratio of time for which a fixed voltage is applied to the gate electrode 13. A fixed voltage VG' is applied to the gate electrode 13 for the time corresponding to the time ratio Du. In such a state, the amount of electron emission from the emitters confronting with the gate electrode 13 can be controlled according to the time ratio Du. The brightness of a large area of the screen can be adjusted accurately under control only to the gate electrode 13.

The foregoing description was primarily directed to a preferred embodiment of the invention. Although some attention was given to various alternatives within the scope of the invention, it is anticipated that one skilled in the art will likely realize additional alternatives that are now apparent from disclosure of embodiments of the invention. Accordingly, the scope of the invention should be determined from the following claims and not limited by the above disclosure.

What is claimed is:

1. An image display device, comprising:

a substrate;

at least one emitter connected to each of a plurality of cathode electrodes formed on said substrate;

a gate electrode disposed adjacent to said emitter;

an anode electrode having a fluorescent substance layer for generating luminescence upon impingement of electrons emitted from each of said emitters connected said cathode electrodes;

a plurality of cathode current control elements formed on said substrate having a cathode current control power terminal connected to each of said plurality of cathode electrodes, and a cathode current control terminal for controlling current passing through said cathode current control power terminal;

a plurality of capacitors each of which is connected to said plurality of cathode current control terminals respectively to keep a voltage corresponding to an amount of electron emission;

a plurality of capacitor voltage control power elements including a capacitor voltage control power terminal connected to each of said plurality of capacitors, a first capacitor voltage control terminal mutually connected in a first group to set a voltage kept in each of said plurality of capacitors, a second capacitor voltage control terminal mutually connected in a second group to determine as to which of said plurality of capacitors to be kept in the amount of voltage corresponding to said amount of electron emission; and a gate electrode control circuit for applying a signal to said gate electrode, said signal being changeable in a time rate which is a rate of time when a constant voltage is applied repetitively, wherein said gate electrode control circuit varies said time rate according to ambient brightness.

2. The image display device as defined in claim 1, wherein said gate electrode is divided into a plurality of sections and gate electrode control circuit applies a constant voltage of each time ratio to each of said plurality of gate electrodes divided.

3. The image display device as defined in claim 1, wherein said gate electrode control circuit sets said constant voltage exceeding at least a white color level corresponding to the highest brightness of said fluorescent substance layer and sets a range of said time rate such that the brightness of said fluorescent substance layer is less than said white level, when said constant voltage is continuously applied to said gate electrode.

4. An image display device, comprising:

a substrate;

at least one emitter connected to each of a plurality of cathode electrodes formed on said substrate;

a gate electrode disposed adjacent to said emitter;

an anode electrode having a fluorescent substance layer for generating luminescence upon impingement of electrons emitted from each of said emitters connected said cathode electrodes;

a plurality of cathode current control elements formed on said substrate having a cathode current control power terminal connected to each of said plurality of cathode electrodes, and a cathode current control terminal for controlling current passing through said cathode current control power terminal;

a plurality of capacitors each of which is connected to said plurality of cathode current control terminals respectively to keep a voltage corresponding to an amount of electron emission;

a plurality of capacitor voltage control power elements including a capacitor voltage control power terminal connected to each of said plurality of capacitors, a first capacitor voltage control terminal mutually connected in a first group to set a voltage kept in each of said plurality of capacitors, a second capacitor voltage control terminal mutually connected in a second group to determine as to which of said plurality of capacitors to be kept in the amount of voltage corresponding to said amount of electron emission; and a gate electrode control circuit for applying a signal to said gate electrode, said signal being changeable in a time rate which is a rate of time when a constant voltage is applied repetitively, wherein said gate electrode control circuit sets said constant voltage exceeding at least a white color level corresponding to the highest brightness of said fluorescent substance layer and sets a range of said time rate such that the brightness of said fluorescent substance layer is less than said white level, when said constant voltage is continuously applied to said gate electrode.

5. The image display device as defined in claim 4, wherein said gate electrode is divided into a plurality of sections and gate electrode control circuit applies a constant voltage of each time ratio to each of said plurality of gate electrodes divided.

6. An image display device, comprising:

a substrate;

at least one emitter connected to each of a plurality of cathode electrodes formed on said substrate;

a gate electrode disposed adjacent to said emitter;

an anode electrode having a fluorescent substance layer for generating luminescence upon impingement of electrons emitted from each of said emitters connected said cathode electrodes;

a plurality of cathode current control elements formed on said substrate having a cathode current control power terminal connected to each of said plurality of cathode electrodes, and a cathode current control terminal for controlling current passing through said cathode current control power terminal;

a plurality of capacitors each of which is connected to said plurality of cathode current control terminals respectively to keep a voltage corresponding to an amount of electron emission;

a plurality of capacitor voltage control power elements including a capacitor voltage control power terminal connected to each of said plurality of capacitors, a first capacitor voltage control terminal mutually connected in a first group to set a voltage kept in each of said plurality of capacitors, a second capacitor voltage control terminal mutually connected in a second group to determine as to which of said plurality of capacitors to be kept in the amount of voltage corresponding to said amount of electron emission; and a gate electrode control circuit for applying a signal to said gate electrode, said signal being changeable in a time rate which is a rate of time when a constant voltage is applied repetitively, wherein said gate electrode control circuit includes a RAM for converting a voltage input to said first capacitor voltage control terminal in accordance with characteristics of said plurality of cathode electrodes.

7. An image display device comprising:

a substrate;

at least one emitter connected to each of a plurality of cathode electrodes formed on said substrate;

a gate electrode disposed adjacent to said emitter;

an anode electrode having a fluorescent substance layer for generating luminescence upon impingement of electrons emitted from each of said emitters connected to said plurality of cathode electrodes;

a plurality of first cathode current control elements formed on said substrate including a first cathode current control power terminal connected to each of said plurality of cathode electrodes, a second cathode current control power terminal for passing through a current from said first cathode current control power terminal, and a first cathode current control terminal for controlling current passing through between said first cathode current control power terminal and said second cathode current control power terminal, said second cathode current control power terminal being connected mutually in a first group, said first cathode current control terminal being connected mutually in a second group;

a second cathode current control element including a second cathode current control terminal for controlling current passing through each of said second cathode current control power terminals connected mutually in said first group;

a selection signal generation circuit for applying a selection signal to either one of said first cathode current control terminal or said second cathode current control terminal to make said cathode current control element belonging to a group selected to active;

a control signal generation circuit for applying a control signal to not selected either one of said first cathode current control terminal or said second cathode current control terminal to control current flowing said cathode current control element belonging to a group selected; and a gate electrode control circuit for applying a signal to said gate electrode, said signal being changeable in a time rate which is a rate of time when a constant voltage is applied repetitively.

* * * * *